(12) United States Patent
Zhang et al.

(10) Patent No.: US 11,596,073 B2
(45) Date of Patent: Feb. 28, 2023

(54) ELECTRONIC EQUIPMENT THAT PROVIDES MULTI-FUNCTION SLOTS

(71) Applicant: EMC IP Holding Company LLC, Hopkinton, MA (US)

(72) Inventors: Kunzheng Zhang, Shanghai (CN); Sandburg Hu, Shanghai (CN); Aric Hadav, Tel Aviv (IL); Xiang Yu, Shanghai (CN); Yuxin Chen, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 98 days.

(21) Appl. No.: 17/237,202

(22) Filed: Apr. 22, 2021

(65) Prior Publication Data

US 2022/0346243 A1     Oct. 27, 2022

(51) Int. Cl.
*H05K 5/02* (2006.01)
*H05K 5/00* (2006.01)
*H05K 7/14* (2006.01)

(52) U.S. Cl.
CPC ........... *H05K 5/0069* (2013.01); *H05K 5/026* (2013.01); *H05K 5/0291* (2013.01); *H05K 7/1435* (2013.01)

(58) Field of Classification Search
CPC .... H05K 5/0069; H05K 5/026; H05K 5/0291; H05K 7/1435
See application file for complete search history.

(56) References Cited

U.S. PATENT DOCUMENTS

| 9,026,708 | B1 |   | 5/2015 | Fenton et al. |  |
|---|---|---|---|---|---|
| 9,703,744 | B2 | * | 7/2017 | Tanaka | G06F 13/4221 |
| 9,836,309 | B2 | * | 12/2017 | Lambert | G06F 13/4022 |
| 9,940,280 | B1 | * | 4/2018 | O'Brien | G06F 13/382 |
| 10,359,815 | B1 | * | 7/2019 | Lin | H01R 12/721 |
| 10,694,635 | B1 | * | 6/2020 | Rivnay | H05K 7/1445 |
| 10,721,832 | B2 | * | 7/2020 | Nelson | G06F 1/20 |
| 10,860,514 | B2 | * | 12/2020 | Zhai | G06F 1/186 |
| 10,963,023 | B1 | * | 3/2021 | Zheng | H05K 7/1409 |
| 11,281,398 | B1 | * | 3/2022 | Zheng | G06F 13/4282 |
| 11,314,666 | B2 | * | 4/2022 | Aharony | G06F 13/4291 |
| 11,422,731 | B1 | * | 8/2022 | Potashnik | G06F 3/067 |
| 11,423,180 | B2 | * | 8/2022 | Young | H04L 9/3247 |
| 2008/0239649 | A1 | * | 10/2008 | Bradicich | G06F 1/183 |
|   |   |   |   |   | 361/725 |
| 2015/0317272 | A1 | * | 11/2015 | Tanaka | G06F 13/4221 |
|   |   |   |   |   | 710/301 |

(Continued)

*Primary Examiner* — Abhishek M Rathod
*Assistant Examiner* — Keith DePew
(74) *Attorney, Agent, or Firm* — BainwoodHuang

(57) ABSTRACT

An electronic equipment assembly has an interconnect including columns of signal conductors, connectors mounted to the columns of signal conductors, and a chassis coupled with the interconnect. The chassis provides slots that guide resource devices into engagement with the connectors mounted to the columns of signal conductors to enable the interconnect to electronically access the resource devices. At least one column of the columns of signal conductors of the interconnect is a multi-function column. Each multi-function column is constructed and arranged to electronically access different types of resource devices through a respective connector mounted to that multi-function column.

20 Claims, 10 Drawing Sheets

(56) References Cited

U.S. PATENT DOCUMENTS

| | | | |
|---|---|---|---|
| 2016/0073544 A1* | 3/2016 | Heyd | G06F 1/20 |
| | | | 361/679.31 |
| 2016/0077841 A1 | 3/2016 | Lambert et al. | |
| 2017/0262029 A1* | 9/2017 | Nelson | H05K 7/1487 |
| 2017/0269871 A1* | 9/2017 | Khan | G06F 3/0653 |
| 2017/0346205 A1* | 11/2017 | Eriksson | H05K 1/117 |
| 2018/0090865 A1* | 3/2018 | Huang | G06F 13/38 |
| 2019/0104632 A1* | 4/2019 | Nelson | H05K 7/20727 |
| 2020/0183862 A1* | 6/2020 | Liu | G06F 13/4282 |
| 2021/0007235 A1* | 1/2021 | Nelson | G06F 1/187 |
| 2021/0084787 A1* | 3/2021 | Weldon | H01R 13/6278 |
| 2021/0127529 A1* | 4/2021 | Hanna | H05K 7/20772 |
| 2022/0207185 A1* | 6/2022 | Young | H04L 9/3247 |

\* cited by examiner

ELECTRONIC EQUIPMENT THAT PROVIDES MULTI-FUNCTION SLOTS

BACKGROUND

A conventional data storage system performs data storage operations on behalf of one or more host computers. Such a data storage system may include an enclosure that holds a midplane, network interface cards (NICs), storage processors (SPs), storage devices, and so on.

During operation, the midplane conveys signals among the NICs, the SPs, the storage devices, and so on. Along these lines, the NICs receive input/output (I/O) requests from the set of host computers. Additionally, the SPs process the I/O requests by storing data into and retrieving data from the storage devices.

SUMMARY

Unfortunately, the above-described conventional data storage system is rigid in its configuration. Along these lines, the conventional data storage system provides only single-function slots that receive only one type of component such as dedicated NIC slots that receive only NICs, other dedicated storage device slots that receive only storage devices, and so on.

Such a dedicated slot design cannot be leveraged to support multiple configurations (e.g., where an extra storage device can be installed in place of an existing NIC, or vice versa). Additionally, such a dedicated slot design limits the capacity for certain resources according to the number of dedicated slots available for that resource. Furthermore, since each slot of such a dedicated slot design cannot be used for other functionality, such a dedicated slot design requires greater expense to incrementally increase capacity once all of the dedicated slots are occupied (e.g., by adding another enclosure and related equipment, by replacing the current enclosure and related equipment with a larger enclosure and related equipment, etc.).

In contrast to the above-described conventional data storage system that provides only single-function slots to receive each component, improved techniques are directed to electronic equipment which utilizes an interconnect having a set of multi-function locations adapted to electronically access different types of resource devices. Such an interconnect enables the electronic equipment to provide multi-function slots (i.e., slots that can receive different types of resource devices). Such different types of resource devices may include, by way of example, storage devices, network interfaces, and compressions/accelerator cards, among others. Accordingly, the operator of such equipment may remove a first type of device (e.g., a compression/accelerator card) from a multi-function slot and insert a second type of device (e.g., a storage device) into that multi-function slot in its place. Moreover, such techniques may involve the use of a set of paddle cards to enable the different types of resource devices to comport to a common set of standards (e.g., so that all of the resource devices similarly fit within the same chassis, so that all of the resource devices comply with the same communications protocol, so that all of the resource devices are capable of hot swapping, combinations thereof, etc.).

One embodiment is directed to an electronic equipment assembly having an interconnect (e.g., a midplane, a backplane, etc.) including columns of signal conductors, connectors mounted to the columns of signal conductors, and a chassis coupled with the interconnect. The chassis provides slots that guide resource devices into engagement with the connectors mounted to the columns of signal conductors to enable the interconnect to electronically access the resource devices. At least one column of the columns of signal conductors of the interconnect is a multi-function column, each multi-function column being constructed and arranged to electronically access different types of resource devices through a respective connector mounted to that multi-function column.

Another embodiment is directed to a method which includes:

(A) installing a set of electronic controllers within an electronic equipment assembly that provides one or more multi-function slots;
(B) installing one or more resource devices within the one or more multi-function slots provided by the electronic equipment assembly; and
(C) providing power to the electronic equipment assembly to operate the set of electronic controllers and the one or more resource devices installed within the one or more multi-function slots.

Yet another embodiment is directed to a data storage system which includes a set of storage controllers, resource devices, and an electronic equipment assembly that couples with the set of storage controllers and the resource devices. The electronic equipment assembly includes:

(A) an interconnect including columns of signal conductors,
(B) connectors mounted to the columns of signal conductors, and
(C) a chassis coupled with the interconnect, the chassis providing slots that guide the resource devices into engagement with the connectors mounted to the columns of signal conductors to enable the interconnect to electronically access the resource devices.

At least one column of the columns of signal conductors of the interconnect is a multi-function column. Each multi-function column is constructed and arranged to electronically access different types of resource devices through a respective connector mounted to that multi-function column.

In some arrangements, the slots provided by the chassis extend from an interior location to a front opening provided by the chassis. Additionally, the interconnect is disposed at the interior location. Furthermore, the resource devices slide within the slots to engage the connectors mounted to the columns of signal conductors of the interconnect.

In some arrangements, the interconnect is a midplane having a front side facing the front opening provided by the chassis and a rear side facing a rear opening provided by the chassis. Additionally, the chassis is constructed and arranged to guide other devices into engagement with other connectors mounted to the front side of the midplane.

In some arrangements, the columns of signal conductors of the interconnect are arranged in a row. Additionally, the columns of signal conductors includes a first multi-function column adjacent a first end of the row (e.g., second from the first end), and a second multi-function column adjacent a second end of the row (e.g., second from the second end) that is opposite the first end of the row.

In some arrangements, the columns of signal conductors further includes single-function columns residing between the first multi-function column and the second multi-function column. Additionally, each multi-function column is constructed and arranged to electronically access a single type of resource devices through a respective connector mounted to that single-function column.

In some arrangements, each multi-function column is constructed and arranged to provide dual-host access to a resource device when that resource device engages a respective connector mounted to that multi-function column.

In some arrangements, the different types of resource devices includes:

(i) a data storage type of resource device, as a first type of resource device, the data storage type of resource device including a first physical port to provide a first storage controller with access to storage space and a second physical port to provide a second storage controller with access to the storage space, and (ii) a data processing type of resource device, as a second type of resource device, the data processing type of resource device including a first physical port through which to process data for the first storage controller and a second physical port through which to process data for the second storage controller.

In some arrangements, the different types of resource devices includes (i) a non-volatile memory type of resource device, as a first type of resource device, the non-volatile memory type of resource device being constructed and arranged to store data in a non-volatile memory space, (ii) a mirroring type of resource device, as a second type of resource device, the mirroring type of resource device being constructed and arranged to coordinate data mirroring operations between storage controllers, and (iii) a compression type of resource device, as a third type of resource device, the compression type of resource device being constructed and arranged to perform data compression operations.

The non-volatile memory type of resource device, the mirroring type of resource device, and the compression type of resource device are different from each other.

In some arrangements, each resource device of the non-volatile memory type has a first length. Each resource device of the mirroring type has a second length that is shorter than the first length. Each resource device of the compression type has the second length that is shorter than the first length. Also, the electronic equipment assembly further includes a set of paddle cards, each paddle card being constructed and arranged to provide extension that extends a resource device having the second length to the first length.

In some arrangements, the electronic equipment assembly further includes a set of paddle cards. Each paddle card having a first edge to connect with a resource device and a second edge to connect with a connector mounted to a multi-function column of the interconnect.

In some arrangements, each paddle card includes a plurality of conductors extending between the first edge and the second edge to convey a plurality of signals when a resource device connects with the first edge and a connector mounted to a multi-function column of the interconnect connects with the second edge.

In some arrangements, the first edge of each paddle card has a first conductor mapping. Additionally, the second edge of each paddle card has a second conductor mapping that is different from the first conductor mapping. Furthermore, the plurality of conductors of each paddle card remaps the first conductor mapping to the second conductor mapping.

In some arrangements, the first edge of each paddle card provides a first connection form factor that complies with the Open Compute Project (OCP) 3.0 Specification. Additionally, the second edge of each paddle card provides a second connection form factor that complies with the Enterprise and Data Center Solid State Device Form Factor (EDSFF) E3 Specification.

In some arrangements, each paddle card further includes a hot-swap controller interconnected between the first edge and the second edge of that paddle card. The hot-swap controller is constructed and arranged to electronically couple a resource device connected to the first edge to a connector mounted to a multi-function column of the interconnect at the second edge while the interconnect is live.

It should be understood that, in the cloud context, at least some electronic circuitry (e.g., hosts, backup sites, etc.) is formed by remote computer resources distributed over a network. Such an electronic environment is capable of providing certain advantages such as high availability and data protection, transparent operation and enhanced security, big data analysis, etc.

Other embodiments are directed to electronic systems and apparatus, arrays, assemblies, enclosures, chassis, processing circuits, componentry, computer program products, and so on. Some embodiments are directed to various methods, electronic components and circuitry which are involved in providing multi-function slots to electronic equipment.

BRIEF DESCRIPTION OF THE DRAWINGS

The foregoing and other objects, features and advantages will be apparent from the following description of particular embodiments of the present disclosure, as illustrated in the accompanying drawings in which like reference characters refer to the same parts throughout the different views. The drawings are not necessarily to scale, emphasis instead being placed upon illustrating the principles of various embodiments of the present disclosure.

DETAILED DESCRIPTION

An improved technique is directed to providing multi-function slots to electronic equipment by utilizing an interconnect having a set of multi-function locations adapted to electronically access different types of resource devices. Such an interconnect enables the electronic equipment to provide multi-function slots via standard connectors, card guides, etc. (i.e., slots that can receive and provide access to different types of resource devices). Such different types of resource devices may include, by way of example, storage devices, network interfaces, and compressions/accelerator cards, among others. Accordingly, the operator of such equipment may remove a first type of device (e.g., a compression/accelerator card) from a multi-function slot and insert a second type of device (e.g., a storage device) into that multi-function slot in place of the first type of device, and vice versa. Moreover, such techniques may involve the use of a set of paddle cards to enable the different types of resource devices to comport to a common set of standards (e.g., so that all of the resource devices similarly fit within the same chassis, so that all of the resource devices comply with the same communications/signaling protocol, so that all of the resource devices are capable of hot swapping, combinations thereof, etc.).

Figure 1:
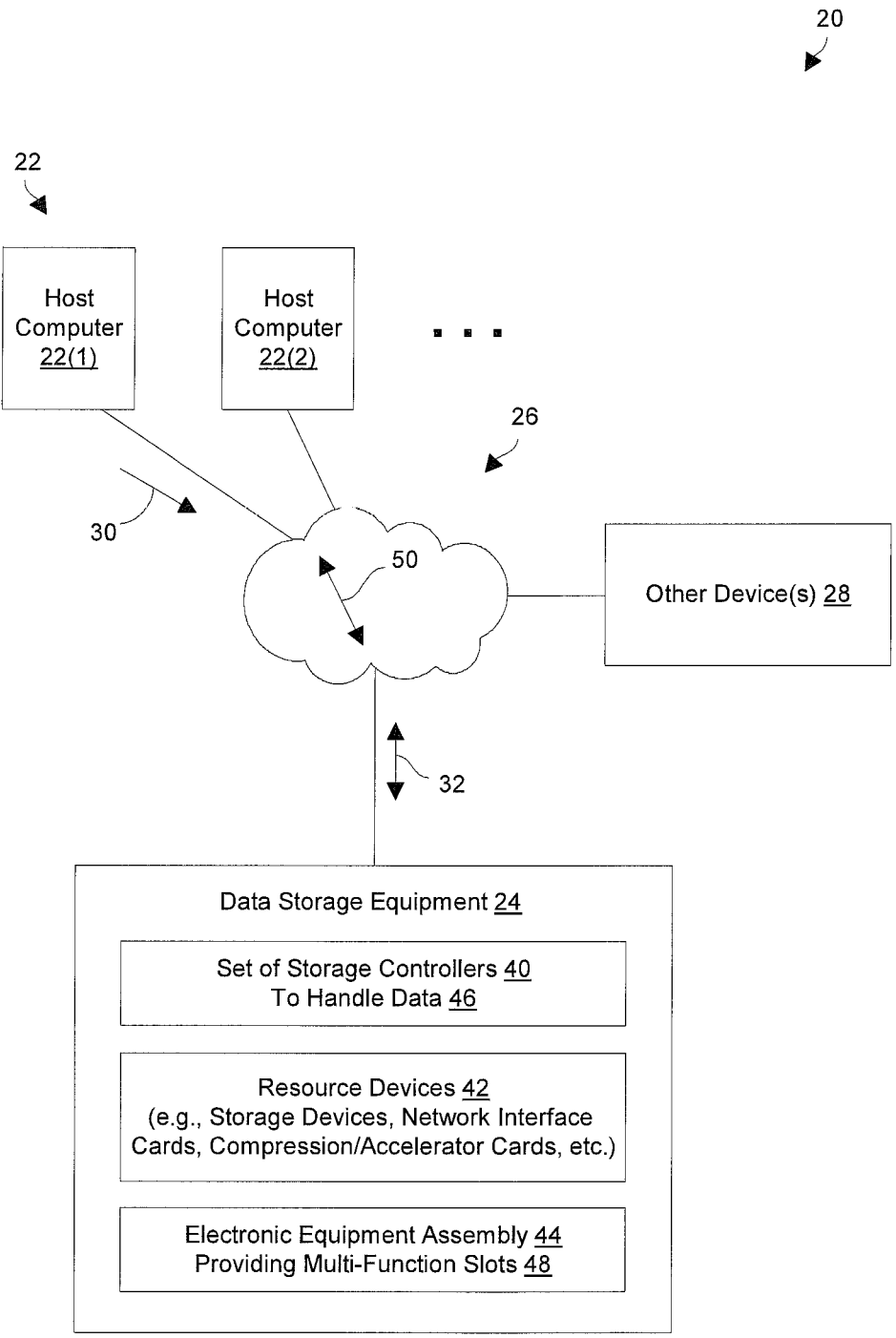
FIG. 1 is a block diagram of an electronic setting which includes electronic equipment that provides multi-function slots in accordance with certain embodiments.

FIG. 1 shows an electronic setting 20 which includes electronic equipment that provides one or more multi-function slots in accordance with certain embodiments. By way of example, the electronic setting 20 is a data storage environment that includes host computers 22(1), 22(2), . . . (collectively, host computers 22), data storage equipment 24, a communications medium 26, and perhaps other devices 28.

Each host computer 22 is constructed and arranged to perform useful work. For example, one or more of the host computers 22 may operate as a file server, a web server, an email server, an enterprise server, a database server, a transaction server, combinations thereof, etc. which provides host input/output (I/O) requests 30 to the data storage equipment 24. In this context, the host computers 22 may provide a variety of different I/O requests 30 (e.g., block and/or file based write commands, block and/or file based read commands, combinations thereof, etc.) that direct the data storage equipment 24 to store host data 32 within and retrieve host data 32 from storage (e.g., primary storage or main memory, secondary storage, tiered storage, combinations thereof, etc.).

The data storage equipment 24 is an example of electronic equipment that provides one or more multi-function slots for configuration flexibility. The data storage equipment 24 includes a set of storage controllers 40, resource devices 42, and an electronic equipment assembly 44 that couples with the set of storage controllers 40 and the resource devices 42. Examples of resource devices 42 include storage devices (e.g., RAM, NVRAM, other solid state memory, hard disk drives (HDDs), combinations thereof, etc.), network interface cards (NICs), specialized compression/accelerator cards to perform cryptographic operations, and so on.

The set of storage controllers 40 is constructed and arranged to respond to the host I/O requests 30 received from the host computers 22 through the NICs by writing data 46 into the storage devices and reading the data 46 from the storage devices. The set of storage controllers 40 may include one or more storage processors or engines, data movers, director boards, blades, I/O modules, storage device controllers, switches, other hardware, combinations thereof, and so on. Additionally, the set of storage controllers 40 may offload certain operations to resource devices 42 such as compression/accelerator cards for data compression/decompression, NICs for communications with external devices, and so on.

The electronic equipment assembly 44 is constructed and arranged to support operation of the various components of the data storage equipment 24. To this end, the electronic equipment assembly 44 conveys power signals from power converters to the various components, positions fans along air pathways to provide cooling (i.e., to remove heat) from the various components, protects the various components against tampering, damage, and so on.

As will be explained in further detail shortly, the electronic equipment assembly 44 provides a set of multi-function slots 48 that enables different types of resource devices 42 to operate therein. Accordingly, the data storage equipment 24 advantageously enjoys flexibility over conventional data storage systems that include only single-function slots which restrict capacity, prevent different configurations, require significant modification or enhancement to incrementally scale, etc.

For example, suppose that the operator of the improved data storage equipment 24 has not fully populated the electronic equipment assembly 44 with resource devices 42. That is, suppose that there is at least one multi-function slot 48 still available (i.e., empty) to receive a new resource device 42. In such a situation, the operator may decide to install a compression/accelerator card into an available multi-function slot 48 if the operator's goal is to improve the compression capabilities of the data storage equipment 24. Alternatively, the operator may decide to install another storage device into that available multi-function slot 48 if the operator's goal is to increase the storage capacity (e.g., NVRAM storage space for a logger) of the data storage equipment 24, and so on.

As another example, suppose that the operator is currently using a first type of resource device 42 such as a compression/accelerator card in a particular multi-function slot 48. The operator may remove the first type of resource device 42 from the particular multi-function slot 48 and install a second type of resource device 42 such as a compression/accelerator card in the particular multi-function slot 48. Each of the first type and second type of resource devices 42 may operate using the same power supplies, cooling, dual-host paths, etc. provided to that slot 48. As a result, the operator is able to successfully reconfigure the equipment such as strengthen one or more features (e.g., improve the compression capabilities of the data storage equipment 24).

A variety of different types of resource devices 42 are suitable for use. Examples include dual-port storage drives, CMI devices, internal fabric connection devices, data cache devices, accelerator devices, and so on.

It should be further appreciated that the various resource devices 42 may have different form factors. Along these lines, some resource devices 42 may have thin and deep form factors, e.g., storage drives that comply with the Enterprise and Data Center Solid State Device Form Factor (EDSFF) E3 Specification. Other resource devices 42 may have thick and deep form factors, e.g., accelerator devices that comply with the EDSFF E3 Specification. Yet other resource devices 42 may have thick and shallow form factors that comply with the Open Compute Project (OCP) 3.0 Specification. Nevertheless, as will be explained in further detail below, any of these resource devices 42 as well as others are able to connect to and operate within the electronic equipment assembly 44 via a multi-function slot 48.

In view of the above-described examples and descriptions, the operator is able to customize the equipment without having to replace existing hardware such as the midplane. Additionally, the operator is able to incrementally expand the capabilities of the equipment without having to add another entire assembly that would require additional power resources, cooling resources, space, etc.

The communications medium 26 is constructed and arranged to connect the various components of the electronic setting 20 together to enable these components to exchange electronic signals 50 (e.g., see the double arrow 50). At least a portion of the communications medium 26 is illustrated as a cloud to indicate that the communications medium 26 is capable of having a variety of different topologies including backbone, hub-and-spoke, loop, irregular, combinations thereof, and so on. Along these lines, the communications medium 26 may include copper-based data communications devices and cabling, fiber optic devices and cabling, wireless devices, combinations thereof, etc. Furthermore, the communications medium 26 is capable of supporting LAN-based communications, SAN-based communications, cellular communications, WAN-based communications, distributed infrastructure communications, other topologies, combinations thereof, etc.

The other devices 28 represent other possible componentry of the electronic setting 20. Along these lines, the other devices 28 may include remote data storage equipment that provides user data 44 to and/or receives user data 44 from the data storage equipment 24 (e.g., replication arrays, backup and/or archiving equipment, service processors and/or management/control devices, etc.). Such other devices 28 may also be provisioned with electronic equipment assemblies 44 that provide multi-function slots 48.

It should be understood that the electronic setting 20 is described as including data storage equipment 24 that provides one or more multi-function slots 48. It should be understood that, in accordance with other embodiments, other electronic settings 20 use equipment that provides one or more multi-function slots 48 (e.g., computer networks, websites, data processing environments, specialized equipment, and so on). Further details will now be provided with reference to FIGS. 2 and 3.

Figure 2:
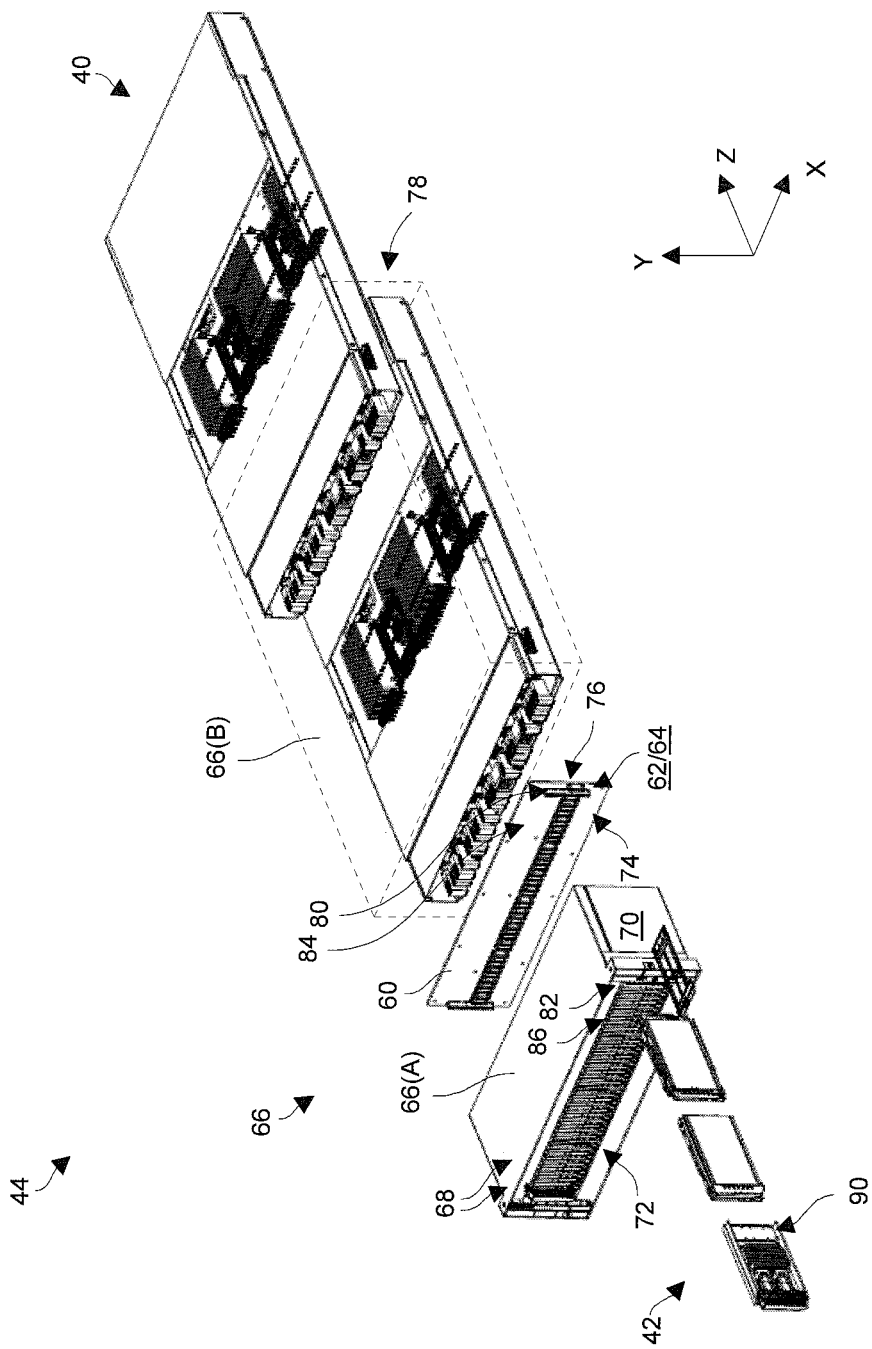
FIG. 2 is a perspective exploded view showing certain details of the electronic equipment of FIG. 1 in accordance with certain embodiments.
Figure 3:
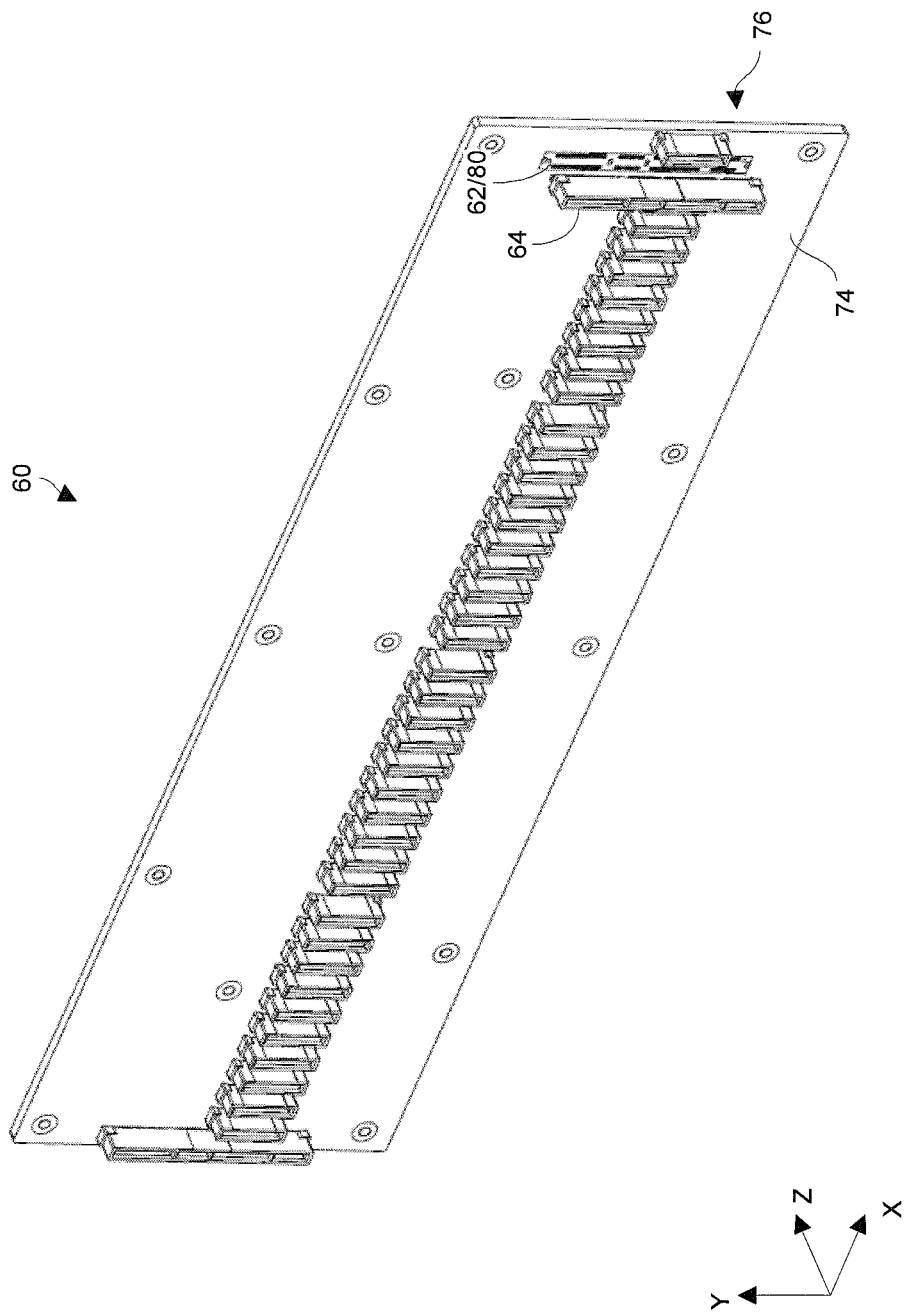
FIG. 3 is a perspective view of additional details in accordance with certain embodiments.

FIGS. 2 and 3 show further electronic equipment details in accordance with certain embodiments. FIG. 2 shows a perspective exploded view of a portion of the data storage equipment 24 in accordance with certain embodiments. FIG. 3 shows additional details in accordance with certain embodiments.

As shown in FIGS. 2 and 3, the electronic equipment assembly 44 includes an interconnect 60 including columns of signal conductors 62 (e.g., pads, solder holes, vias, etc.), connectors 64 mounted to the columns of signal conductors 62, and a chassis 66 coupled with the interconnect 60. The chassis 66 provides slots 68 that guide the resource devices 42 into engagement with the connectors 64 mounted to the columns of signal conductors 62 to enable the interconnect 60 to electronically access the resource devices 42.

In accordance with certain embodiments, the chassis 66 includes multiple chassis portions 66(A), 66(B), . . . (e.g., enclosures, housings, panels, etc.) to simplify construction, assembly, access, etc. By way of example, the chassis portion 66(A) is shown as receiving the resource devices 42 oriented vertically (e.g., in the Y-Z plane), and the chassis portion 66(B) is shown (in phantom) as receiving the storage controllers 40 oriented horizontally (e.g., in the X-Z plane).

As best seen in FIG. 2, the slots 68 provided by the chassis 66 extend from an interior chassis location 70 to a front opening 72 provided by the chassis 66. The interconnect 60 is disposed at the interior chassis location 70, and the resource devices 42 slide within the slots 68 (e.g., the positive Z-direction) to engage the connectors 64 mounted to the columns of signal conductors 62 of the interconnect 60.

In accordance with certain embodiments, the interconnect 60 is a midplane having a front side 74 facing the front opening 72 provided by the chassis 66 and a rear side 76 facing a rear opening 78 provided by the chassis 66. However, in other embodiments, the interconnect 60 may take other forms such as a backplane, a motherboard, other single or multi-PCB structures, and so on.

The chassis 66 is constructed and arranged to guide various components into engagement with connecting structures mounted on the interconnect 60 (e.g., in the positive Z-direction through the front opening 72, and in the negative Z-direction through the rear opening 78). To this end, the chassis 66 may include guide structures (e.g., guide members, rails, etc.) that define channels. For example, for the resource devices 42, the chassis 66 may include top and bottom guides for the slots 68 so that once a resource device 42 inserts into a slot 68 at the front opening 76, the resource device 42 remains captured within that slot 68 by the guides as resource device 42 is pushed further into the chassis 66 and into proper alignment and engagement with a connector 64 mounted to the interconnect 60.

As best seen in FIG. 3 and in accordance with certain embodiments, the columns of signal conductors 62 of the interconnect 60 are arranged in a row (e.g., the columns are arranged along the X-axis). As a result, the connectors 64 and the slots 68 are also arranged in a row. Such a design enables easy access to each slot 68 from the front opening 72.

Each column of signal conductors 62 (and thus each connector 64) is elongated and extends vertically (e.g., along the Y-axis). The particular dimensions, geometries, and features of the columns of signal conductors 62 and the connectors 64 may be based on the particular requires for each slot 68 (e.g., single-function vs. multi-function, signal densities, signal types, power requirements, and so on). In some arrangements, the connectors 64 are multi-lane high speed connectors such as 1C, 2C, 4C and 4C+ connectors in compliance with the SFF-TA-1002 Rev. 1.3 standard.

It should be understood that certain additional features and components (e.g., openings to enable air flow, alignment posts, traces, integrated and discrete components, other pins and connectors, etc.) may exist. However, such features may have been omitted from FIG. 3 for simplicity.

Additionally, in accordance with certain embodiments, the second-most outer columns of signal conductors 62 of the interconnect 60 are multi-function columns 80 of signal conductors 62 (FIG. 3). Each multi-function column 80 of signal conductors 62 is constructed and arranged to electronically access different types of resource devices 42 (e.g., a storage device, or a NIC, or a compression/accelerator card, etc.) through a respective connector 64 (e.g., a 4C+ connector) mounted to that multi-function column 80 of signal conductors 62. Accordingly, such a feature provides for multi-function slots 82 adjacent the ends of the opening 72 (also reference the multi-function slots 48 in connection with FIG. 1).

It should be understood that the resource devices 42 may have a thin profile or a thick profile along the X-axis. When resource devices 42 having the thin profile are used in the outer slot 68 and the second-outer slot 68 of the row, the outer slot 68 of the row is a single-function slot 86 and the second-outer slot 68 of the row is a multi-function slot 82.

Such features are best appreciated as shown by the 4C+ connector as the connector 64 for the second-outer slot 68 as seen in FIG. 3.

However, when a resource device 42 having the thick profile is used in the second-outer slot 68 of the row, the outer slot 68 of the row is also consumed by that resource devices 42 due to the thickness. Accordingly, the outer slot 68 of the row may be considered the multi-function slot 82 even though the resource device 42 connects with the connector 64 aligned with the second-outer slot 68 of the row (i.e., the 4C+ connector) since another resource device 42 cannot fit and connect with the outer most connector 64.

Also, in accordance with certain embodiments, the inner columns of signal conductors 62 of the interconnect 60 are single-function columns 84. Each single-function column 84 is constructed and arranged to electronically access a single type of resource devices 42 (e.g., only a storage device) through a respective connector 64 (e.g., a 1C connector) mounted to that single-function column 84. Accordingly, the inner slots are single-function slots 86.

In accordance with certain embodiments, the last slot 68 at the ends of the opening 72 may be provisioned with a connector 64 mounted to a single-function column 84. Such a situation enables the second-most outer slot 68 (i.e., the multi-function slot 82) and the outer most slot 68 (i.e., a single-function slot 84) to hold thinner resource devices 42 such as storage devices.

It should be understood that, in accordance with certain embodiments, the electronic equipment assembly 44 provides an interior row of single-function slots 86, and two multi-function slots 82 (one multi-function slot 82 adjacent each end of the interior row). However, in other embodiments, other electronic equipment assemblies 44 include a different number of single-function slots 86, a different number of multi-function slots 82, and/or slots 82, 86 in different locations (e.g., no single-function slots 86, interleaved multi-function slots 82 and single-function slots 86, interleaved groups of multi-function slots 82 and single-function slots 86, and so on).

As best seen in FIG. 2, each multi-function slot 82 is able to receive a variety of different types of resource devices 42 at different times. Such resource devices 42 may store data (e.g., storage devices), communicate data (e.g., NICs), process data (e.g., compression/accelerator cards), combinations thereof, and so on.

Examples of storage devices include solid state devices (SSDs), hard disk drives (HDDs), hybrid devices, optical memory, tape memory, RAM, and so on. A particular storage device that is well suited for installation within the multi-function slot 82 is a dual-host non-volatile random access memory (NVRAM) device. Along these lines, a pair of NVRAM devices may provide mirrored storage for holding a logger (i.e., a log-based storage structure) that may be accessed by multiple storage processors (SPs), e.g., also see the storage controllers 40 in FIG. 1. It should be appreciated that the outer two connectors 64 may receive thinner form factor storage devices thus providing increased storage capacity.

Examples of NICs include Ethernet adapters, Fibre Channel adapters, switches, combinations thereof, and so on. Each NIC may have dual-host ports as well thus providing each SP with two communications paths to external devices.

Examples of compression/accelerator cards includes specialized cards that compress/decompress data. Again each compression/accelerator card may have dual-host ports enabling each SP (or host) to access that card.

One should appreciate that dual-host connectivity provided to each slot and by each resource device provides certain advantages. For example, such dual-host connectivity enables fault tolerance (e.g., extra paths to the resources), load balancing, and so on.

It should be appreciated that some resource devices 42 (e.g., NVRAM devices) may have a relatively deep (or long) form factor (i.e., along the Z-axis) and thus fully fit within a multi-function slot 82. That is, when such a resource device 42 fully fits within such a slot 86, the connecting edge of the resource device 42 properly engages a connector 64 on the interconnect 60, and the opposite edge extends to the front opening 72 of the chassis 66.

However, in accordance with certain embodiments, the electronic equipment assembly 44 further includes a set of paddle cards 90 to accommodate other resource devices 42 that have shallower form factors (i.e., along the Z-axis) and thus do not fully fit within a multi-function slot 82. Such a paddle card 90 engages with such a resource device 42 to provide the extra geometry requirements enabling the resource device 42 to properly fit within the slot 86 and engage with the interconnect 60 through a connector 64 (e.g., enabling the shallower form factor resource devices 42 to extend fully to the front opening 72 of the chassis 66).

Figure 4:
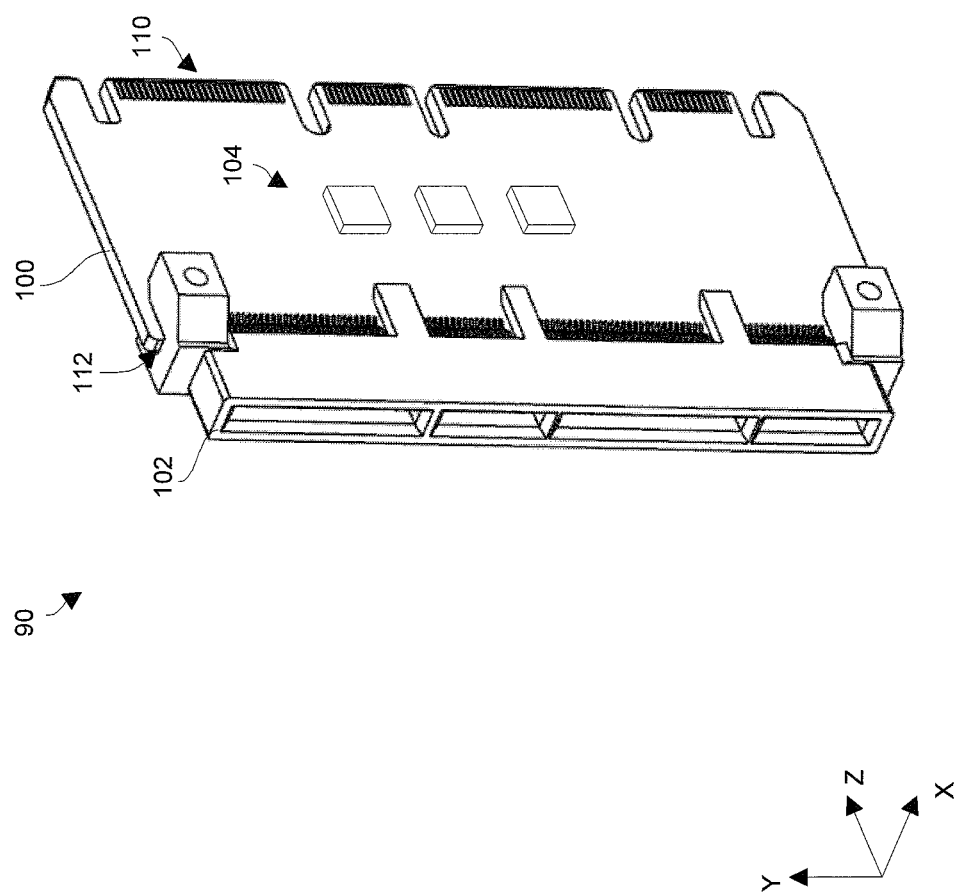
FIG. 4 is a perspective view showing a paddle card of the electronic equipment of FIG. 1 in accordance with certain embodiments.
Figure 5:
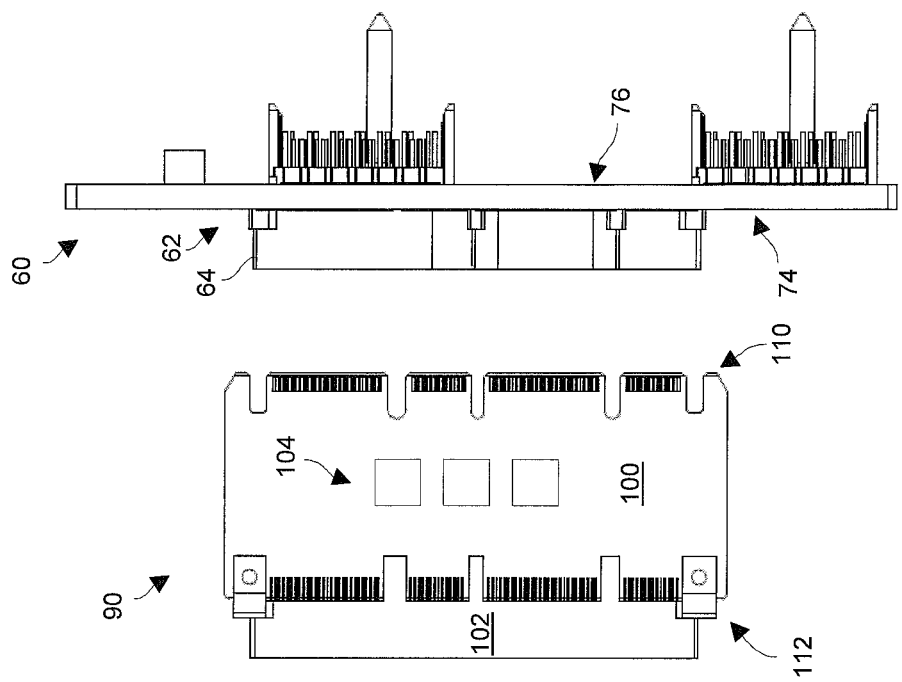
FIG. 5 is side view of the paddle card in use in accordance with certain embodiments.
Figure 5:
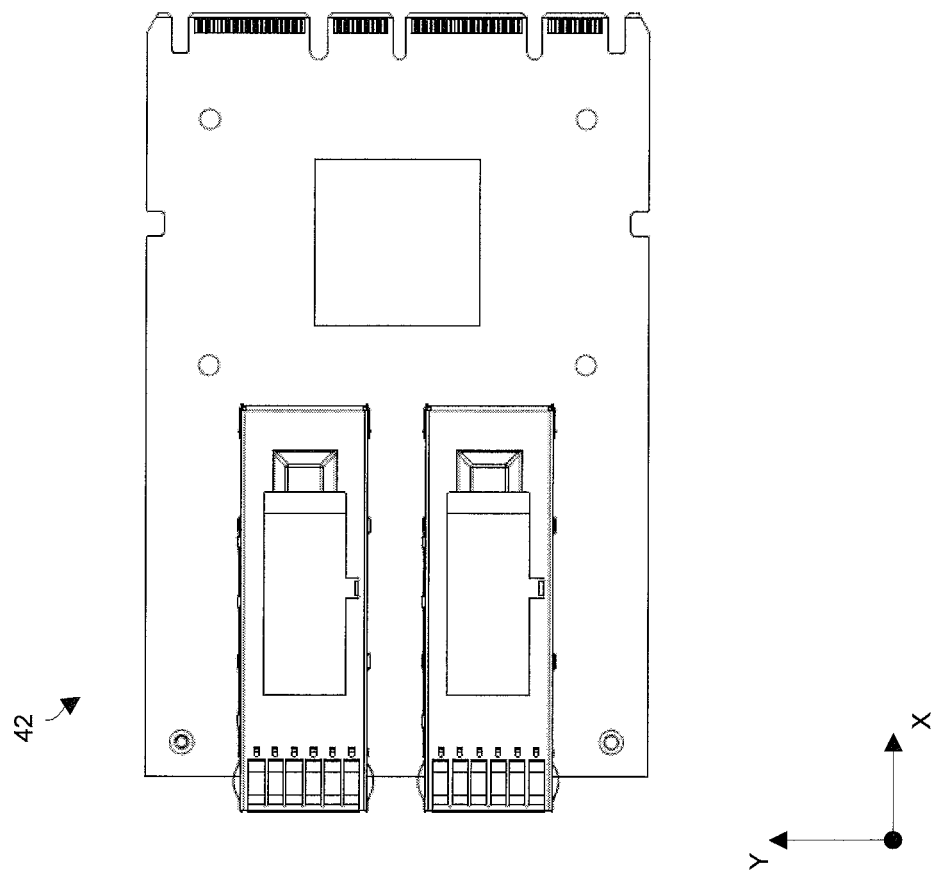
Figure 6:
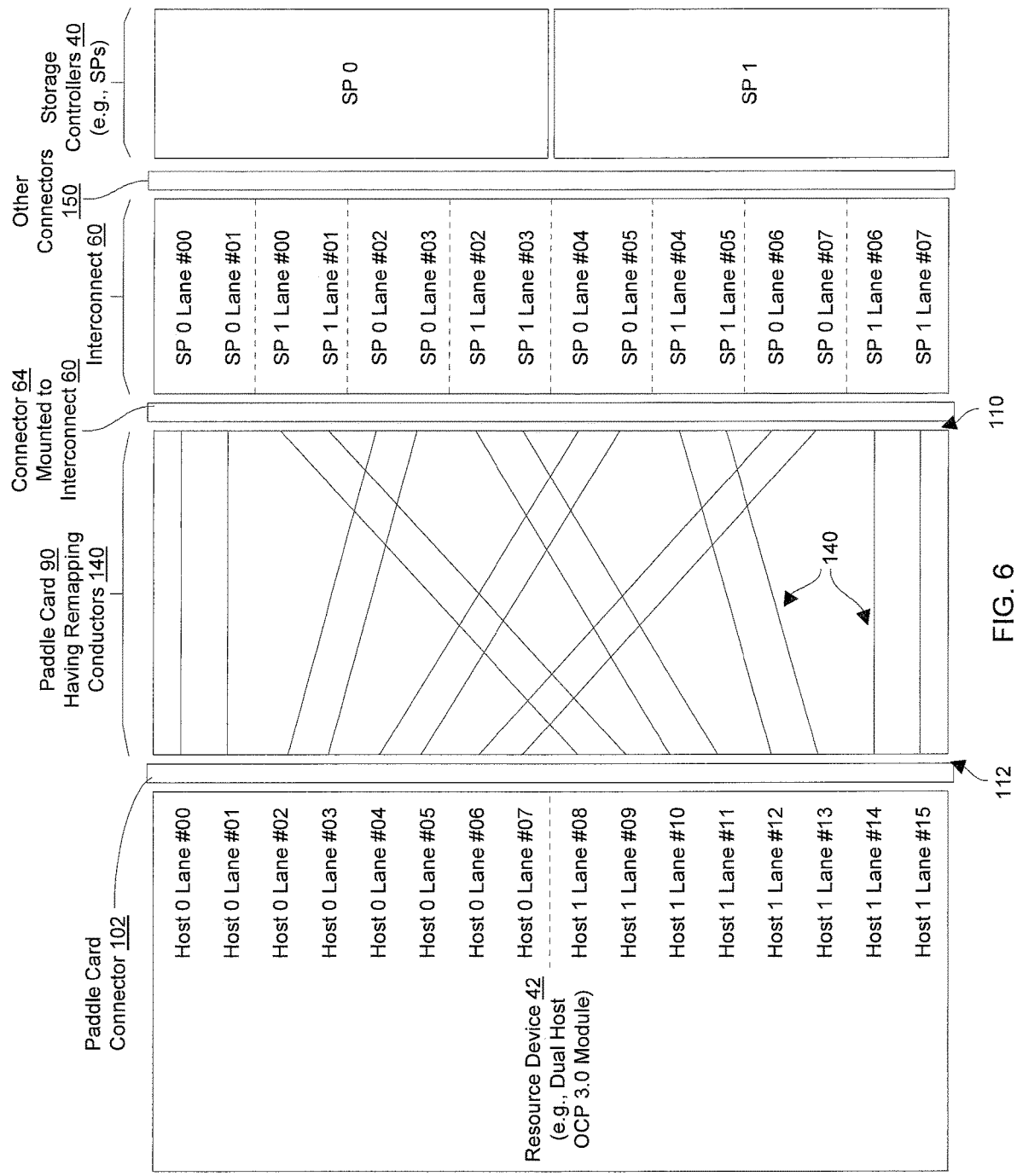
FIG. 6 shows certain remapping details provided by a paddle card in accordance with certain embodiments.

FIGS. 4 through 6 show certain details of an example paddle card 90. FIG. 4 shows a perspective view of the example paddle card 90 in accordance with certain embodiments. FIG. 5 shows a side view of the example paddle card 90 ready to connect a resource device 42 with the interconnect 60 in accordance with certain embodiments. FIG. 6 shows a paddle card mapping feature in accordance with certain embodiments.

As shown in FIGS. 4 through 6, the paddle card 90 is constructed and arranged to provide extension for a shallower resource device 42. That is, for a resource device 42 having a shallow form factor, the paddle card 90 extends the length of the resource device to a new length thus enabling a front facing edge of the resource device 42 to sit at the front opening 72 of the electronic equipment assembly 44 while the resource device 42 electronically connects with the interconnect 60 through the paddle card 90. Accordingly, the front facing edge of the resource device 42 having the shallow form factor is able to sit substantially flush with those of other resource devices 42 such as resource devices 42 that have a deep form factor that connect with the interconnect 60 without using a paddle card 90 (also see FIG. 2).

As best seen in FIG. 4, the paddle card 90 includes a card portion 100, a connector 102, and electronic features 104. The card portion 100 includes circuit board material (e.g., layers of conductive and non-conductive material sandwiched together) to provide power planes, ground planes, signal paths, component mounting locations, connecting pads/fingers, etc. The planar shape of the paddle card 90 (e.g., in the Y-Z plane) is similar to that of the resource devices 42 thus enabling the paddle card 90 to fit within a multi-function slot 82 of the electronic equipment assembly 44 (FIG. 2).

In accordance with certain embodiments, a connecting edge 110 of the card portion 100 is constructed and arranged to engage with a connector 64 (e.g., a 4C+ connector) mounted to the interconnect 60. Such a connecting edge 110 matches the connecting edge of a resource device 42 that has a deep form factor that connect with the interconnect 60 without using a paddle card 90. Along these lines, the connector edge 110 may include a predefined contact layout (e.g., pad geometries) to match a corresponding connector 64, notches/grooves to ensure proper orientation, alignment, connectivity, etc.

It should be appreciated that, in accordance with other embodiments that involve resource devices 42 that use device connectors rather than pads/fingers, the paddle card 90 may include a similar device connector in place of the connecting edge 110. Regardless of the connecting method, such connecting features enable a resource device 42 that has a shallow form factor to use a paddle card 90 to match the connecting abilities of a resource device 42 having a deep form factor.

The connector 102 of the paddle card 90 mounts to an edge 112 of the card portion 100 that is opposite the connecting edge 110. In accordance with certain embodiments, the connector 102 (e.g., a 4C+ connector) provides/complies with the same geometries, protocols, standards, pinouts, etc. as those of the connectors 64 mounted to the interconnect 60. In accordance with other embodiments, the connector 102 modifies one or more of the geometries, protocols, standards, pinouts, etc. as those of the connectors 64 mounted to the interconnect 60. It should be understood that the connector 102 is an edge mount connector rather than a surface mount connector by way of example only and that surface mount connectors are suitable for use as well.

The electronic features 104 of the paddle card 90 enable the paddle card 90 to adjust various electronic behaviors and/or perform certain operators to facilitate connectivity. Suitable electronic features 104 include signal paths, signal pads (e.g., fingers, leads, sockets, vias, etc.), signal conditioning circuitry, interfacing circuitry, and the like.

For example, in accordance with certain embodiments, the paddle card 90 includes conductors (e.g., traces, planes, etc.) extending between the edge 110 and the edge 112 to convey signals when a resource device 42 connects with the edge 112 and the connector 64 mounted to a multi-function column 62 of the interconnect 60 connects with the edge 110. Such connectivity enables the resource device 42 to properly communicate with interconnect 60 but nevertheless extend to the opening 72 of the chassis 66 (also see FIG. 2). In some embodiments, the conductors are arranged into one or more Peripheral Component Interconnect (PCI) Express Lanes.

As another example, in accordance with certain embodiments, the edge 110 has a first conductor mapping, and the edge 112 has a second conductor mapping that is different from the first conductor mapping. Accordingly, the conductors (or traces) of the paddle card 90 remap the first conductor mapping to the second conductor mapping. In some embodiments, the mappings remap different PCI Express Lanes (e.g., from a configuration in which the lanes are grouped by host to another configuration in which the lanes for each host are interleaved).

FIG. 6 shows certain paddle card mapping details for remapping conductors 140 of a particular resource device 42 from a first mapping where lanes are grouped by host to a second mapping where the lanes for each host are interleaved in accordance with certain embodiments. In accordance with certain embodiments, the conductors 140 are arranged in PCIe lanes, and the paddle card 90 provides normalization into dual host PCIe lanes.

As shown, the edge 110 of the paddle card 90 provides a connection form factor that complies with the Enterprise and Data Center Solid State Device Form Factor (EDSFF) E3 Specification. Furthermore, the edge 112 of the paddle card 90 provides a first connection form factor that complies with the Open Compute Project (OCP) 3.0 Specification.

Accordingly, one should appreciate that the particular resource device 42 is a dual hose Open Compute Project (OCP) 3.0 Module (e.g., a hardware component that a form factor and features that comply with the OCP 3.0 Specification). As a result, the resource device 42 has signal conductors arranged along the connecting edge such that the signal conductors for a first host (e.g., Host 0) are in one region on the connecting edge, and the signal conductors for a second host (e.g., Host 1) are in another region on the connecting edge.

However, as further shown in FIG. 6, two storage controllers 40 (or hosts) connect to the interconnect 60. In particular, each storage controller 40 connects to a respective set of connectors 150 on the back side 74 of the interconnect 60. The conductors (e.g., traces, planes, vias, etc.) of interconnect 60 then extend to a column of signal conductors 62 which connect to a connector 64 mounted to the front side 72 of the interconnect 60 (also see FIGS. 2 and 3). In accordance with certain embodiments, the conductor mapping for the column of signal conductors 62 and the connector 64 complies with the Enterprise and Data Center Solid State Device Form Factor (EDSFF) E3 Specification making the slot 78 well suited for E3 storage drives. Nevertheless, the resource device 42 is able to be properly accessed by both storage controllers 40 via the dual-host PCIe interface normalization performed by the paddle card 90.

As yet another example, the paddle card 90 may include circuitry that enables hot-plugging. Along these lines, the circuitry 104 may include a hotplug (or hot-swap) controller interconnected between the edge 110 and the edge 112. It should be appreciated that OCP 3.0 cards typically do not include hotplugging functionality since such functionality is usually offloaded to another connecting device. The hot-swap controller on the paddle card 90 is constructed and arranged to electronically couple a resource device 42 connected to the edge 112 to a connector 64 mounted to a multi-function column 62 of the interconnect 60 at the opposite edge 110 while the interconnect 60 is live.

As yet a further example, the paddle card 90 may include circuitry that enables proper signal exchange. Along these lines, the circuitry 104 may include control glue logic interconnected between the edge 110 and the edge 112. Such control glue logic is constructed and arranged to adjust certain signals to compensate for differences between the E3 standard and the OCP standard. That is, each standard and perhaps other standards may have different control pin definitions (e.g., voltage levels, bit levels, bit patterns, etc.) and the control glue logic converts the signals from one standard to the other. Accordingly, the paddle card 90 enables a resource device 42 to connect to the electronic equipment assembly 44 even if the connecting interface of the resource device 42 is different than that of the electronic equipment assembly 44.

It should be understood that, in accordance with certain embodiments, more than one of the above-described paddle card features are combined. In some embodiments, the paddle card 90 has all of the above-described features. Further details will now be provided with reference to FIGS. 7 through 9.

Figure 7:
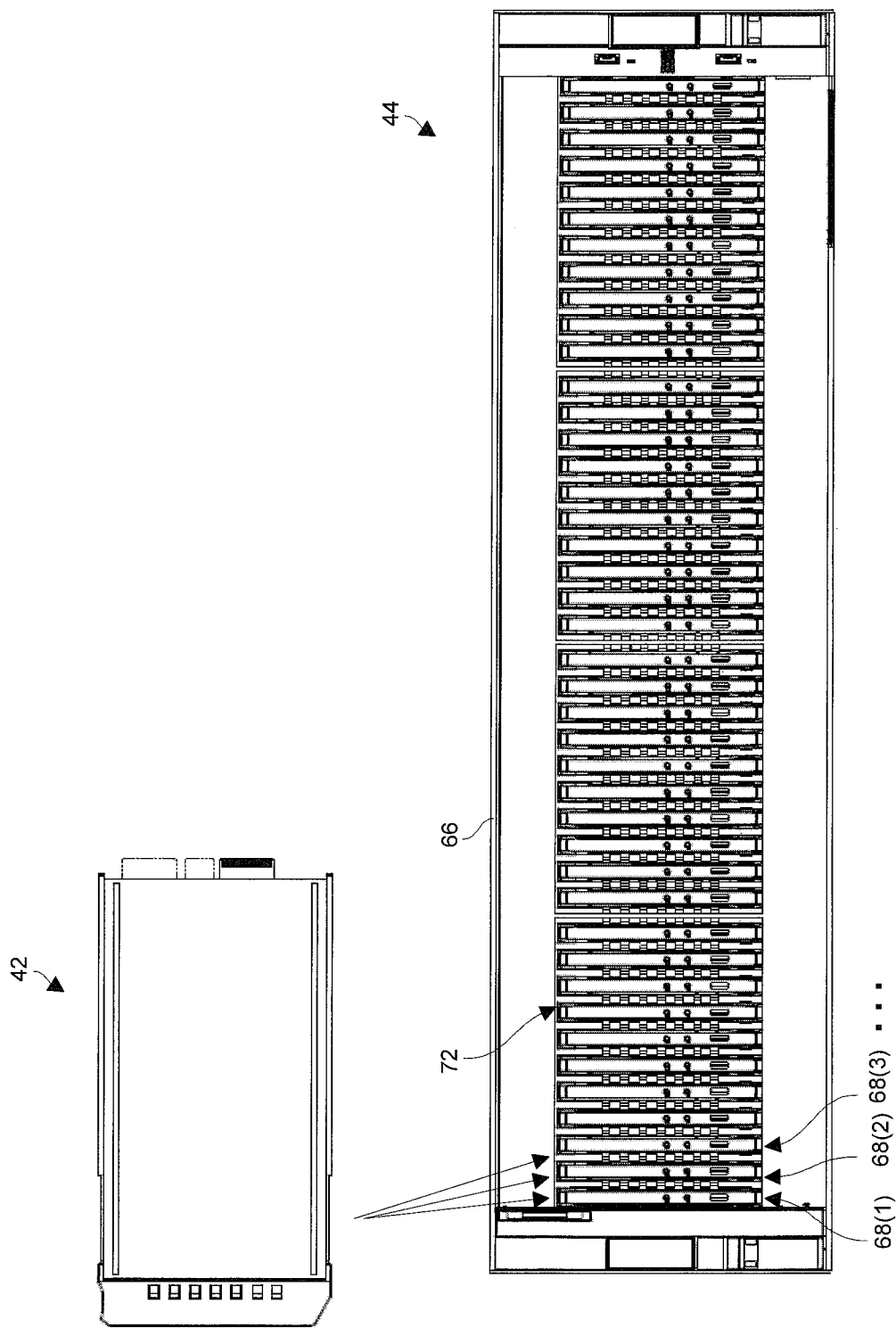
FIG. 7 is a view illustrating how a multi-function slot provided by the electronic equipment uses of a first type of device.
Figure 8:
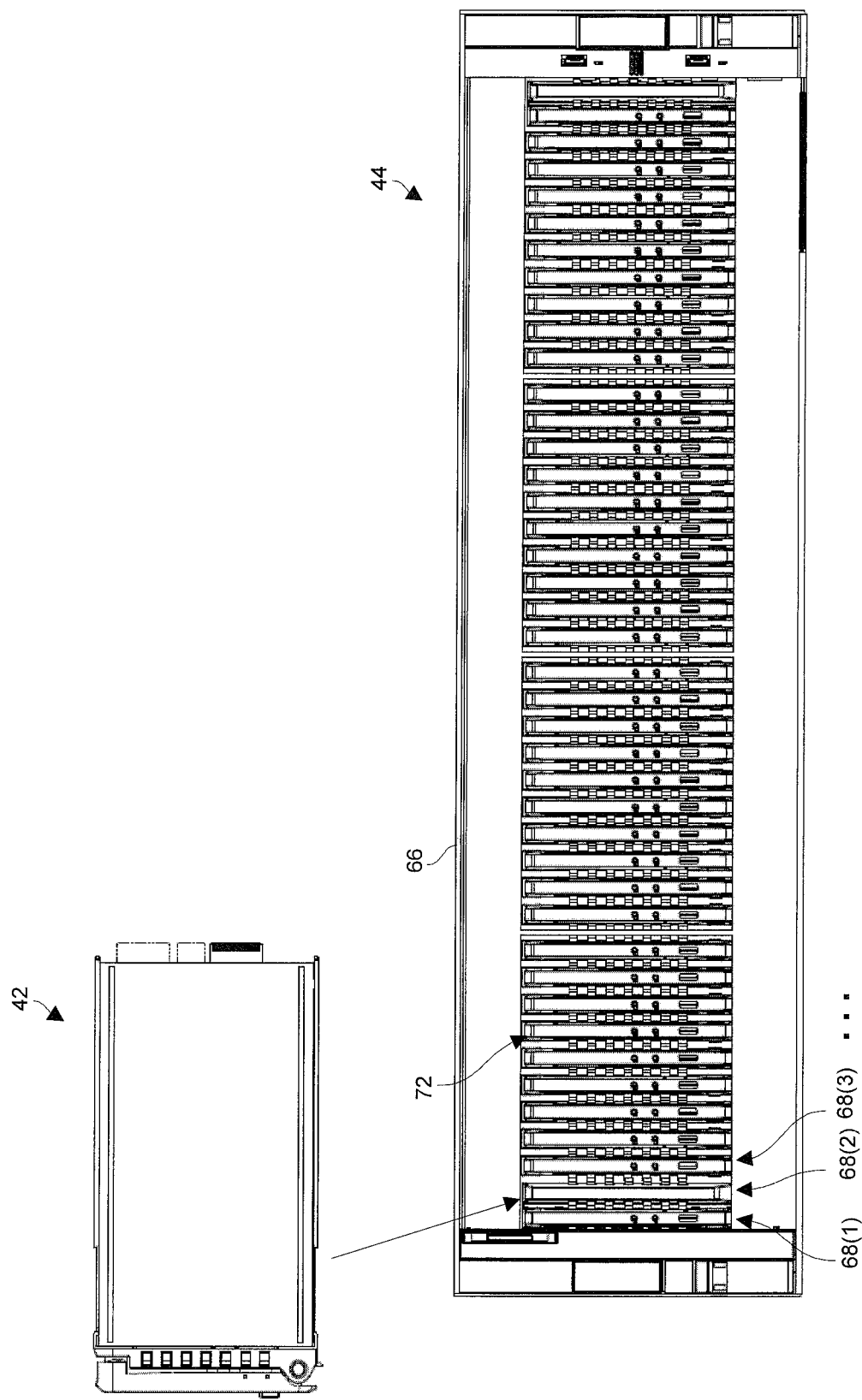
FIG. 8 is a view illustrating how the multi-function slot provided by the electronic equipment uses of a second type of device.
Figure 9:
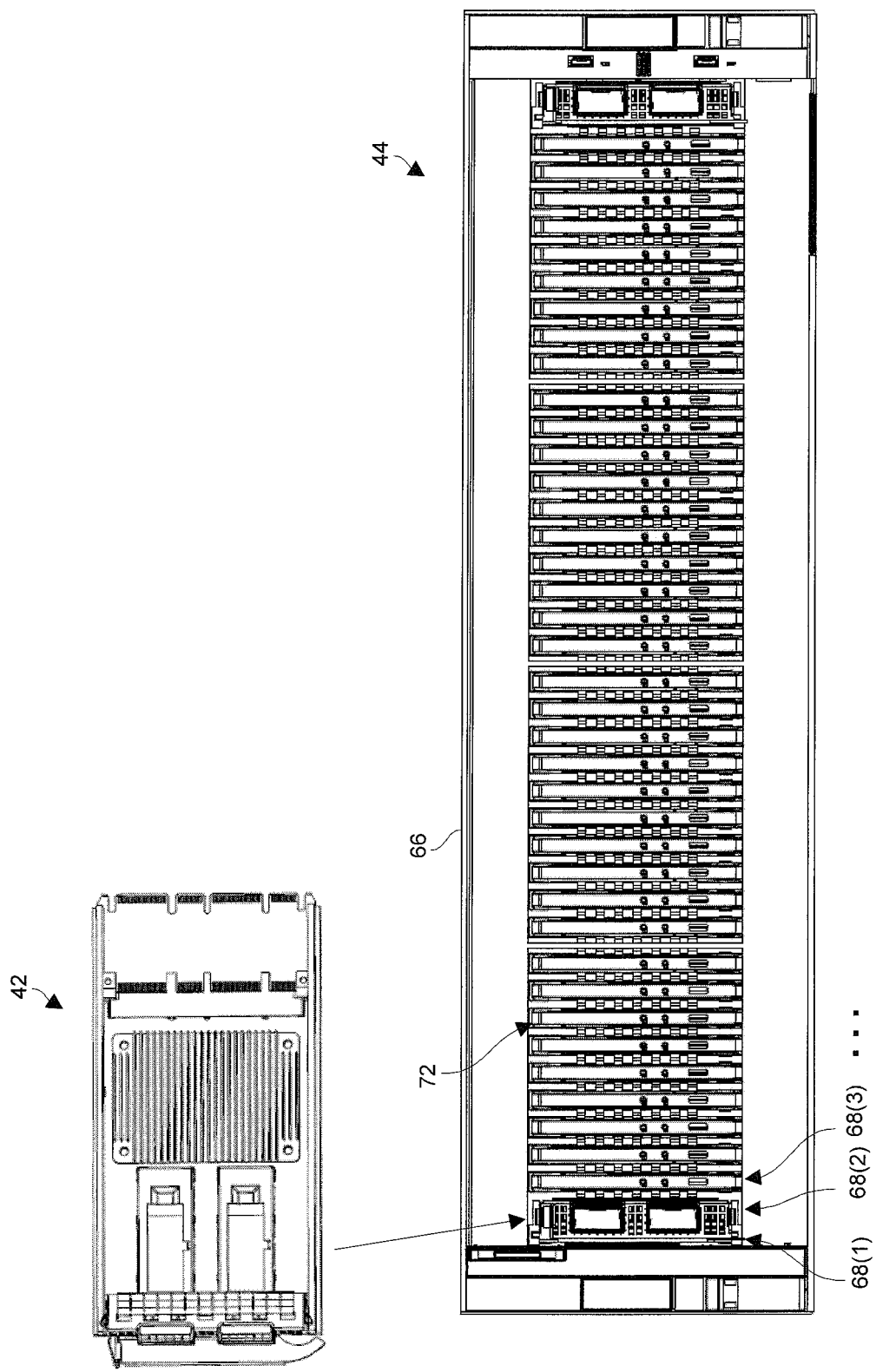
FIG. 9 is a view illustrating how the multi-function slot provided by the electronic equipment uses of a third type of device.

FIGS. 7 through 9 show a variety of different types of resource devices that are suitable for use within a multi-function slot 78. FIG. 7 shows how a multi-function slot 78 provided by the electronic equipment uses of a first type of device. FIG. 8 shows how the multi-function slot 78 provided by the electronic equipment uses of a second type of device. FIG. 9 shows how the multi-function slot 78 provided by the electronic equipment uses of a third type of device.

With reference to FIG. 7, all of the resource device 42 are by way of example storage devices. Accordingly, each of the outer most slot 68(1), the second-outer-most slot 68(2), and the third-outer-most slot 68(3) (and so on) at the opening 72 holds a respective storage device. In accordance with certain embodiments, such storage devices may be dual host EDSFF NVMe, E3 drives having thin form factors (e.g., along the X-axis in FIG. 2).

In this situation, the slot 68(2) is a multi-function slot and currently holds a storage device. Additionally, since the storage device has a deep form factor and complies with the E3 Specification, no paddle card 90 is used.

With reference to FIG. 8, the resource devices 42 in the outer most slot 68(1) and the third-outer-most slot 68(3) at the opening 72 are storage devices. However, the resource device 42 in the second-outer-most slot 68(2) is a dual host compression/accelerator card (e.g., to perform compression and decompression operations).

Since the compression/accelerator card has a deep form factor and complies with the E3 Specification, no paddle card 90 is used. Furthermore, since the compression/accelerator card has a relatively thin profile (e.g., along the X-axis in FIG. 2), there is room to utilize the outer-most slot 68(1).

At this point, it should be appreciated that the second-outer-most slot 68(2) operates as a multi-function slot 82 since it supports operation of different types of resource devices 42, e.g., storage devices (FIG. 7) and compression/accelerator cards (FIG. 8). Such flexibility enables the configuration of the electronic equipment assembly 44 to change without making any modifications to the interconnect 60, the connectors 64, the chassis 66, etc.

With reference to FIG. 9, the first resource device 42 in the row is by way of example a dual host CMI (mirroring) card. Such a CMI card enables the storage controllers 40 to perform cache mirroring operations.

Due to the shallower form factor of the CMI card, a paddle card 90 is used to extend the reach of the CMI card thus enabling the front of the CMI card to reside at the front opening 72 with the other resource devices 42. It should be appreciated that the connecting edge of the CMI card may follow the OCP 3.0 Specification. Accordingly, the paddle card 90 further operates to adapt the OCP 3.0 interface of the CMI card to the E3 interface of the connector 64 (e.g., a 4C+ connector) on the interconnect 60 (also see FIGS. 3 through 6).

Furthermore, since the dual host CMI card has a relatively thick profile (e.g., along the X-axis in FIG. 2), there is no room to utilize the outer-most slot 68(1). That is, the dual host CMI card consumes both the outermost slot 68(1) and the second-outer-most slot 68(2). Accordingly, the end slots 68(1) and 68(2) of the row at the opening 72 is essentially the multi-function slot 82 in this configuration. Further details will now be provided with reference to FIG. 10.

Figure 10:
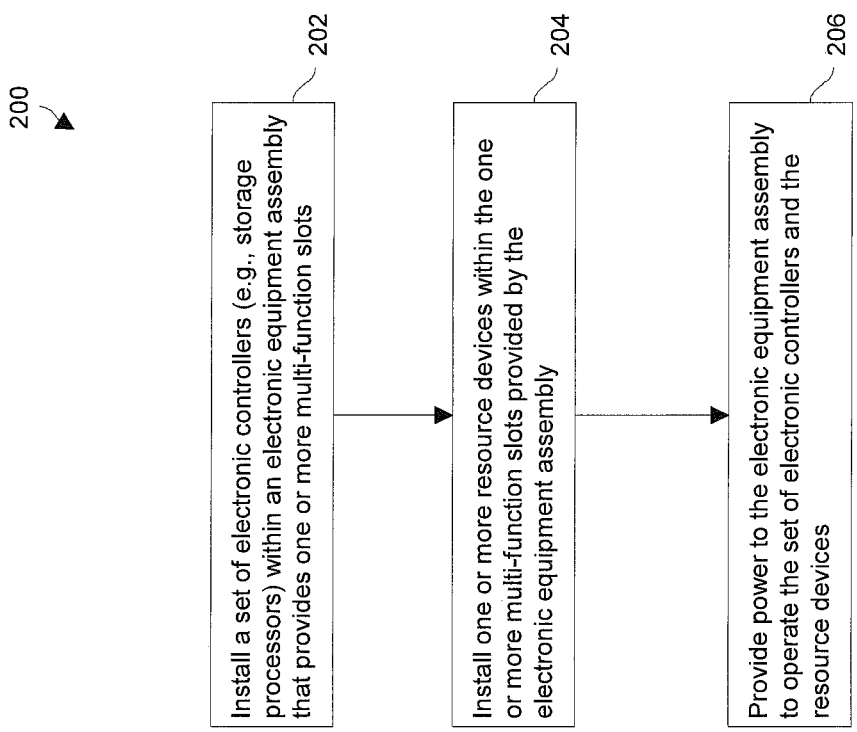
FIG. 10 is a flowchart of a procedure which utilizes a multi-function slot provided by electronic equipment in accordance with certain embodiments.

FIG. 10 is a flowchart of a procedure 200 that provides a set of multi-function slots to electronic equipment by utilizing an interconnect having a set of multi-function locations adapted to electronically access different types of resource devices. Such a procedure enables data storage equipment to have flexibility over a conventional data storage system that include only single-function slots which restrict capacity, prevent different configurations, require significant modification or enhancement to incrementally scale, and so on.

At 202, a set of electronic controllers is installed within an electronic equipment assembly that provides one or more multi-function slots. In the context of a data storage environment, each electronic controller may be a storage processor that performs data storage operations.

At 204, one or more resource devices is installed within the one or more multi-function slots provided by the electronic equipment assembly. If there were resource devices of different types previously installed with the slots, the resource devices of the different types may be removed and replaced with new resource devices.

At 206, power is provided to the electronic equipment assembly to operate the set of electronic controllers and the one or more resource devices installed within the one or more multi-function slots. In the data storage context, examples of such resource devices include storage devices, network interface cards, and compression/accelerator cards, among others, thus enabling the electronic equipment to operate in a different configuration, e.g., with different storage capacity, different connectivity, different processing power, and so on.

As described above, improved techniques are directed to electronic equipment which utilizes an interconnect 60 having a set of multi-function locations 62 adapted to electronically access different types of resource devices 42. Such an interconnect 60 enables the electronic equipment to provide multi-function slots 48, 82 (i.e., slots that can receive different types of resource devices). Such different types of resource devices 42 may include, by way of example, storage devices, network interfaces, and compressions/accelerator cards, among others. Accordingly, the operator of such equipment may remove a first type of device (e.g., a compression/accelerator card) from a multi-function slot and insert a second type of device (e.g., a storage device) into that multi-function slot 48, 82 in its place. Moreover, such techniques may involve the use of a set of paddle cards 90 to enable the different types of resource devices 42 to comport to a common set of standards (e.g., so that all of the resource devices similarly fit within the same chassis, so that all of the resource devices 42 comply with the same communications protocol, so that all of the resource devices are capable of hot swapping, combinations thereof, etc.).

While various embodiments of the present disclosure have been particularly shown and described, it will be understood by those skilled in the art that various changes in form and details may be made therein without departing from the spirit and scope of the present disclosure as defined by the appended claims.

For example, it should be understood that various components of the electronic setting 20 such as one or more host computers 22 and/or one or more other devices 28 are capable of being implemented in or "moved to" the cloud, i.e., to remote computer resources distributed over a network. Here, the various computer resources may be distributed tightly (e.g., a server farm in a single facility) or over relatively large distances (e.g., over a campus, in different cities, coast to coast, etc.). In these situations, the network connecting the resources is capable of having a variety of different topologies including backbone, hub-and-spoke, loop, irregular, combinations thereof, and so on. Additionally, the network may include copper-based data communications devices and cabling, fiber optic devices and cabling, wireless devices, combinations thereof, etc. Furthermore, the network is capable of supporting LAN-based communications, SAN-based communications, combinations thereof, and so on.

It should be understood that, in a conventional data storage system, there are dedicated single function slots for each type of module. That is, there may be dual-port drive slots for dual-port storage drives, CMI slots for CMI modules, internal fabric connection slots for internal fabric connection cards, data cache slots for data cache devices, accelerator slots for accelerator devices, and so on.

Such a rigid, dedicated slot design has the following problems:
1. There is no opportunity to leverage the rigid, dedicated slot design without increasing the design cost.
2. The dedicate slots limit the extension for each unique function, i.e., each kind of the dedicated slot is limited in number which cannot be further increased/extended.
3. There is no flexibility, i.e., the dedicated slot design cannot be used for other functionality if requirements change.

Other drawbacks exist as well such as the manufacturer having to make and support different designs, and so on.

However, it should be appreciated that dual host devices are critical ingredients to high availability storage appliances. Use cases may include, but are not limited to:
1. Dual-host drives through which each storage controller can share storage media
2. Dual-host CMI devices which allow local node mirroring of vital information to peer nodes
3. Dual-host accelerator cards which enable on-the-fly compression/encryption to mirrored data As disclosed herein, an electronic equipment assembly provides a multi-function slot that is configurable according to accommodate these different product use cases.

With such improvements, there is no longer a lack of a common slot and interface for various types of dual host devices. Accordingly, the same design may now be reused across different platforms. Such design reuse reduces cost, effort, overhead, and so on.

Additionally, with such improvements, there is now product configuration flexibility. For example, in a full storage stack, each enclosure may require different configuration, e.g. a storage controller on the top needs an internal CMI, an intelligent drive expansion shelf needs accelerator card, and so on. The customer is no longer required to change the enclosure, which would have been troublesome, in order to change the configuration.

In accordance with certain embodiments, certain slots are normalized to be "multi-function" dual-host slots. Such a multi-function slot can support different standard form factor modules, e.g. EDSFF3" (E3.L) and OCP3.0.

In accordance with certain embodiments, each multi-function slot is designed for multi-host mode. That is, the equipment may include multiple hosts (or controllers), and each slot can talk to each host with up to Gen5 x8 PCIe bandwidth.

It should be appreciated that, from a system building perspective, each platform can be designed with a proper number of multi-function slots in order to meet the different product requirements. Such normalization to a common multi-function dual-host slot enables better design reuse and product configuration flexibility.

Innovation Abstract:

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

Along these lines, the electronic equipment assemblies were described above as connecting to controllers on the opposite side. It should be understood that other types of electronic equipment assemblies, enclosures, cabinets, etc. may provide multi-function slots using the above-described improvements and techniques as well. Such modifications and enhancements are intended to belong to various embodiments of the disclosure.

What is claimed is:
1. Electronic equipment assembly, comprising:
an interconnect including columns of signal conductors;
connectors mounted to the columns of signal conductors;
a chassis coupled with the interconnect, the chassis providing slots that guide resource devices into engagement with the connectors mounted to the columns of signal conductors to enable the interconnect to electronically access the resource devices, at least one column of the columns of signal conductors of the interconnect being a multi-function column, each multi-function column being constructed and arranged to electronically access different types of resource devices through a respective connector mounted to that multi-function column; and
a set of paddle cards, each paddle card having a first edge to connect with a resource device and a second edge to connect with a connector mounted to a multi-function column of the interconnect;
wherein the first edge of each paddle card provides a first connection form factor that complies with the Open Compute Project (OCP) 3.0 Specification; and
wherein the second edge of each paddle card provides a second connection form factor that complies with the Enterprise and Data Center Solid State Device Form Factor (EDSFF) E3 Specification.

2. Electronic equipment assembly as in claim 1 wherein the slots provided by the chassis extend from an interior location to a front opening provided by the chassis;
wherein the interconnect is disposed at the interior location; and
wherein at least some of the resource devices are constructed and arranged to slide within the slots to engage the connectors mounted to the columns of signal conductors of the interconnect.

3. Electronic equipment assembly as in claim 2 wherein the interconnect is a midplane having a front side facing the front opening provided by the chassis and a rear side facing a rear opening provided by the chassis; and
wherein the chassis is constructed and arranged to guide other devices into engagement with other connectors mounted to the front side of the midplane.

4. Electronic equipment assembly as in claim 1 wherein the columns of signal conductors of the interconnect are arranged in a row; and
wherein the columns of signal conductors includes a first multi-function column adjacent a first end of the row, and a second multi-function column adjacent a second end of the row that is opposite the first end of the row.

5. Electronic equipment assembly as in claim 4 wherein the columns of signal conductors further includes single-function columns residing between the first multi-function column and the second multi-function column; and
wherein each multi-function column is constructed and arranged to electronically access a single type of resource devices through a respective connector mounted to that single-function column.

6. Electronic equipment assembly as in claim 1 wherein each multi-function column is constructed and arranged to provide dual-host access to a resource device when that resource device engages a respective connector mounted to the that multi-function column.

7. Electronic equipment assembly as in claim 6 wherein the different types of resource devices includes:
   a data storage type of resource device, as a first type of resource device, the data storage type of resource device including a first physical port to provide a first storage controller with access to storage space and a second physical port to provide a second storage controller with access to the storage space, and
   a data processing type of resource device, as a second type of resource device, the data processing type of resource device including a first physical port through which to process data for the first storage controller and a second physical port through which to process data for the second storage controller.

8. Electronic equipment assembly as in claim 1 wherein the different types of resource devices includes:
   a non-volatile memory type of resource device, as a first type of resource device, the non-volatile memory type of resource device being constructed and arranged to store data in a non-volatile memory space,
   a mirroring type of resource device, as a second type of resource device, the mirroring type of resource device being constructed and arranged to coordinate data mirroring operations between storage controllers, and
   a compression type of resource device, as a third type of resource device, the compression type of resource device being constructed and arranged to perform data compression operations,
   the non-volatile memory type of resource device, the mirroring type of resource device, and the compression type of resource device being different from each other.

9. Electronic equipment assembly as in claim 8 wherein each resource device of the non-volatile memory type has a first length;
   wherein each resource device of the mirroring type has a second length that is shorter than the first length;
   wherein each resource device of the compression type has the second length that is shorter than the first length; and
   wherein at least one each paddle card is constructed and arranged to provide extension that extends a resource device having the second length to the first length.

10. Electronic equipment assembly as in claim 1 wherein each paddle card further includes:
    a plurality of conductors extending between the first edge and the second edge to convey a plurality of signals when a resource device connects with the first edge and a connector mounted to a multi-function column of the interconnect connects with the second edge.

11. Electronic equipment assembly as in claim 10 wherein the first edge of each paddle card has a first conductor mapping;
    wherein the second edge of each paddle card has a second conductor mapping that is different from the first conductor mapping; and
    wherein the plurality of conductors of each paddle card remaps the first conductor mapping to the second conductor mapping.

12. Electronic equipment assembly as in claim 10 wherein each paddle card further includes:
    a hot-swap controller interconnected between the first edge and the second edge of that paddle card, the hot-swap controller being constructed and arranged to electronically couple a resource device connected to the first edge to a connector mounted to a multi-function column of the interconnect at the second edge while the interconnect is live.

13. Electronic equipment assembly as in claim 10 wherein the first edge of each paddle card has a first conductor mapping;
    wherein the second edge of each paddle card has a second conductor mapping that is different from the first conductor mapping;
    wherein the plurality of conductors of each paddle card remaps the first conductor mapping to the second conductor mapping;
    wherein each paddle card further includes:
    a hot-swap controller interconnected between the first edge and the second edge of that paddle card, the hot-swap controller being constructed and arranged to electronically couple a resource device connected to the first edge to a connector mounted to a multi-function column of the interconnect at the second edge while the interconnect is live.

14. Electronic equipment assembly as in claim 1 wherein the interconnect is a midplane having a front side facing the front opening provided by the chassis and a rear side facing a rear opening provided by the chassis;
    wherein the connectors mount on the front side of the midplane; and
    wherein a set of storage controllers connect with the rear side of the midplane.

15. Data storage system, comprising:
    a set of storage controllers;
    resource devices; and
    an electronic equipment assembly that couples with the set of storage controllers and the resource devices, the electronic equipment assembly including:
    an interconnect including columns of signal conductors, connectors mounted to the columns of signal conductors,
    a chassis coupled with the interconnect, the chassis providing slots that guide the resource devices into engagement with the connectors mounted to the columns of signal conductors to enable the interconnect to electronically access the resource devices, at least one column of the columns of signal conductors of the interconnect being a multi-function column, each multi-function column being constructed and arranged to electronically access different types of resource devices through a respective connector mounted to that multi-function column; and
    a set of paddle cards, each paddle card having a first edge to connect with a resource device and a second edge to connect with a connector mounted to a multi-function column of the interconnect;
    wherein the first edge of each paddle card provides a first connection form factor that complies with the Open Compute Project (OCP) 3.0 Specification; and
    wherein the second edge of each paddle card provides a second connection form factor that complies with the Enterprise and Data Center Solid State Device Form Factor (EDSFF) E3 Specification.

16. Data storage system as in claim 15 wherein the interconnect of the electronic equipment assembly is a midplane having a front side facing the front opening provided by the chassis and a rear side facing a rear opening provided by the chassis;
   wherein the connectors mount on the front side of the midplane; and
   wherein a set of storage controllers connect with the rear side of the midplane.

17. A method, comprising:
   installing a set of electronic controllers within an electronic equipment assembly that provides one or more multi-function slots;
   installing one or more resource devices within the one or more multi-function slots provided by the electronic equipment assembly;
   providing power to the electronic equipment assembly to operate the set of electronic controllers and the one or more resource devices installed within the one or more multi-function slots; and
   installing a set of paddle cards within the electronic equipment assembly, each paddle card having a first edge to connect with a resource device and a second edge to connect with a connector mounted to a multi-function column of the interconnect;
   wherein the first edge of each paddle card provides a first connection form factor that complies with the Open Compute Project (OCP) 3.0 Specification; and
   wherein the second edge of each paddle card provides a second connection form factor that complies with the Enterprise and Data Center Solid State Device Form Factor (EDSFF) E3 Specification.

18. A method as in claim 17 wherein the interconnect of the electronic equipment assembly is a midplane having a front side facing the front opening provided by the chassis and a rear side facing a rear opening provided by the chassis;
   wherein the connectors mount on the front side of the midplane; and
   wherein the set of storage controllers install on the rear side of the midplane.

19. A method as in claim 17 wherein installing the one or more resource devices includes:
   connecting an edge of a resource device with a portion of a paddle card, and
   inserting the resource device within the electronic equipment assembly while the edge of the resource device is connected with the portion of a paddle card, the paddle card being installed contemporaneously with the resource device.

20. A method as in claim 17 wherein installing the set of paddle cards includes:
   inserting a paddle card within the electronic equipment assembly while a portion of the paddle card is connected with an edge of the resource device, the resource device being installed contemporaneously with the paddle card.

\* \* \* \* \*